(12) United States Patent
Kraft et al.

(10) Patent No.: US 9,995,894 B2
(45) Date of Patent: Jun. 12, 2018

(54) SEMICONDUCTOR DEVICE WITH OPTICAL AND ELECTRICAL VIAS

(71) Applicant: ams AG, Unterpremstaetten (AT)

(72) Inventors: Jochen Kraft, Oberaich (AT); Karl Rohracher, Graz (AT); Jordi Teva, Veldhoven (NL)

(73) Assignee: ams AG, Unterpremstaetten (AT)

( * ) Notice: Subject to any disclaimer, the term of this patent is extended or adjusted under 35 U.S.C. 154(b) by 37 days.

(21) Appl. No.: 15/028,934

(22) PCT Filed: Oct. 8, 2014

(86) PCT No.: PCT/EP2014/071560
§ 371 (c)(1),
(2) Date: Apr. 12, 2016

(87) PCT Pub. No.: WO2015/055480
PCT Pub. Date: Apr. 23, 2015

(65) Prior Publication Data
US 2016/0259139 A1    Sep. 8, 2016

(30) Foreign Application Priority Data
Oct. 14, 2013    (EP) .................................... 13188483

(51) Int. Cl.
*G02B 6/12*    (2006.01)
*H01L 21/00*    (2006.01)
(Continued)

(52) U.S. Cl.
CPC ....... *G02B 6/4283* (2013.01); *G02B 6/12002* (2013.01); *G02B 6/13* (2013.01);
(Continued)

(58) Field of Classification Search
CPC .... G02B 2006/121; G02B 2006/12107; G02B 2006/12121; G02B 2006/12123;
(Continued)

(56) References Cited

U.S. PATENT DOCUMENTS 4,268,113 A    5/1981   Noel, Jr.
4,656,352 A    4/1987   Langenwalter et al.
(Continued)

FOREIGN PATENT DOCUMENTS

DE    102011104305 A1    12/2012
EP       0017701 A1    10/1980
(Continued)

OTHER PUBLICATIONS

Brodkin, Jon: "Holey chip! IMB drills holes into optical chip for terabit-per-second speed", ars technica, Aug. 3, 2012, <https://arstechnica.com/business/2012/03/holey-chip-ibm-drills-holes-into-optical-chip-for-terabit-per-second-speed/>.

*Primary Examiner* — Jerry Rahll
*Assistant Examiner* — Michael Mooney
(74) *Attorney, Agent, or Firm* — McDermott Will & Emery LLP

(57) ABSTRACT

The method comprises providing a semiconductor substrate, which has a main surface and an opposite further main surface, arranging a contact pad above the further main surface, forming a through-substrate via from the main surface to the further main surface at a distance from the contact pad and, by the same method step together with the through-substrate via, forming a further through-substrate via above the contact pad, arranging a hollow metal via layer in the through-substrate via and, by the same method step together with the metal via layer, arranging a further metal via layer in the further through-substrate via, the further metal via layer contacting the contact pad, and removing a (Continued)

bottom portion of the metal via layer to form an optical via laterally surrounded by the metal via layer.

8 Claims, 3 Drawing Sheets

(51) Int. Cl.
| | |
|---|---|
| *H01L 23/48* | (2006.01) |
| *H01L 31/16* | (2006.01) |
| *G02B 6/42* | (2006.01) |
| *G02B 6/43* | (2006.01) |
| *H05K 1/02* | (2006.01) |
| *H05K 1/11* | (2006.01) |
| *G02B 6/13* | (2006.01) |
| *H05K 1/18* | (2006.01) |
| *H05K 3/42* | (2006.01) |
| *H05K 3/46* | (2006.01) |

(52) U.S. Cl.
CPC ............. *G02B 6/4274* (2013.01); *G02B 6/43* (2013.01); *H01L 23/481* (2013.01); *H01L 31/16* (2013.01); *H05K 1/0274* (2013.01); *H05K 1/115* (2013.01); *G02B 6/428* (2013.01); *G02B 2006/121* (2013.01); *G02B 2006/12107* (2013.01); *G02B 2006/12121* (2013.01); *G02B 2006/12123* (2013.01); *G02B 2006/12147* (2013.01); *H01L 2224/16225* (2013.01); *H05K 1/116* (2013.01); *H05K 1/181* (2013.01); *H05K 3/429* (2013.01); *H05K 3/4605* (2013.01); *H05K 2201/0939* (2013.01); *H05K 2201/09518* (2013.01); *H05K 2201/09581* (2013.01); *H05K 2201/10174* (2013.01)

(58) Field of Classification Search
CPC ...... G02B 2006/12147; G02B 6/12002; G02B 6/13; G02B 6/4274; G02B 6/428; G02B 6/4283; G02B 6/43; H05K 1/0274; H05K 1/115; H05K 1/116; H05K 1/181; H05K 2201/0939; H05K 2201/09518; H05K 2201/09581; H05K 2201/10174
USPC ........................................... 385/14, 129–132
See application file for complete search history.

(56) References Cited

U.S. PATENT DOCUMENTS

| | | |
|---|---|---|
| 8,231,284 B2 | 7/2012 | Doany et al. |
| 8,265,432 B2 | 9/2012 | Doany et al. |
| 8,488,921 B2 | 7/2013 | Doany et al. |
| 2007/0085215 A1 | 4/2007 | Budd et al. |
| 2010/0195954 A1 | 8/2010 | Asai et al. |
| 2010/0232744 A1* | 9/2010 | Asai ........................ G02B 6/43 385/14 |
| 2013/0099256 A1 | 4/2013 | Lee |
| 2013/0177277 A1 | 7/2013 | Fujiwara et al. |
| 2014/0191413 A1* | 7/2014 | Minixhofer ....... H01L 21/76898 257/774 |

FOREIGN PATENT DOCUMENTS

| | | |
|---|---|---|
| EP | 0175936 A1 | 4/1986 |
| EP | 1491927 A1 | 12/2004 |
| EP | 2620978 A1 | 7/2013 |
| WO | 03/039216 A1 | 5/2003 |

\* cited by examiner

SEMICONDUCTOR DEVICE WITH OPTICAL AND ELECTRICAL VIAS

BACKGROUND OF THE INVENTION

Photodiodes and vertical cavity surface emitting lasers (VCSELs) can be mounted on a semiconductor chip comprising an integrated circuit (IC) to form an optical module, which combines optical functions like optical data transfer, switching, multiplexing and modulation with electronical functions like data processing. A wave guide leading through the semiconductor chip is required for a transfer of optical signals between opposite surfaces of the chip.

U.S. Pat. No. 8,231,284 B2 discloses an optical module comprising an array of photodiodes and VCSELS mounted to a single-chip CMOS optical transceiver in flip-chip technology.

U.S. Pat. No. 8,265,432 B2 discloses an optical module comprising a chip with integrated circuit, optical windows and a plurality of optoelectronic devices, which are positioned in alignment with the windows and attached in flip-chip technology.

U.S. Pat. No. 8,488,921 B2 discloses an arrangement of an electronic IC with optical vias providing access for multicore fibers to a plurality of photodiodes and VCSELs.

US 2013/0099256 A1 discloses a multi-chip package of chips each having a light receiving element in the sidewall of a via hole. The chips are stacked on a substrate with the via holes aligned. An optical signal from a light emitting element of the substrate is focused by an electrically adjustable lens into the light receiving elements.

EP 1 491 927 B1 discloses a substrate for mounting an IC chip. Optical paths penetrating the substrate are constituted by a resin composition, a vacancy and a conductor layer formed around the resin composition and the vacancy. Conductor circuits and interlaminar insulating layers are serially built up on both faces of the substrate, and the conductor circuits on both sides of the substrate are connected to one another by a plated-through hole and via-holes, respectively. A light receiving element and a light emitting element are mounted confronting the optical paths for transmitting optical signals. Solder bumps are formed on one of the faces of the substrate.

US 2010/0195954 A1 discloses devices that are similar to devices described in EP 1 491 927 B1, including optical paths formed by a resin composite without conductor layer formed around the optical path.

US 2007/0085215 A1 discloses methods of fabricating a vertical channel guide optical via through a silicon substrate, including means for transferring, coupling and/or focusing light to or from an optoelectronic device mounted on the substrate, like a lens or a grating. An annular via formed by a silicon post is clad with a sequence of layers comprising decreasing refractive index and is used to guide the light.

WO 03/039216 A1 discloses a carrier arrangement for carrying optical components, comprising a substrate with a via filled with an optically conductive filling, which may be transparent and comprises at least two materials. Electro-optical components are mounted.

EP 0 175 936 A1 discloses an optoelectronic arrangement including a carrier, which can be a semiconductor chip. The carrier comprises a hole provided as a light guide. The side wall of the hole carries a metallic cover.

EP 0 017 701 A1 discloses an arrangement of an optical fiber in the opening of a substrate. The opening is provided with a metallic socket. An optical transducer is arranged with an active region facing the optical fiber.

US 2013/0177277 A1 discloses an arrangement of an optical waveguide mounted on a circuit board together with a light-emitting element and a semiconductor device.

SUMMARY OF THE INVENTION

The method of producing a semiconductor device with optical via and electrical via comprises providing a semiconductor substrate, which has a main surface and an opposite further main surface, with a contact pad arranged below the further main surface, forming a through-substrate via from the main surface to the further main surface at a distance from the contact pad and, by the same method step together with the through-substrate via, forming a further through-substrate via from the main surface to the further main surface above the contact pad, arranging a hollow metal via layer in the through-substrate via and, by the same method step together with the metal via layer, arranging a further metal via layer in the further through-substrate via, the further metal via layer contacting the contact pad, and removing a bottom portion of the metal via layer to form an optical via laterally surrounded by the metal via layer.

In a variant of the method, the thickness of the metal via layer in the through-substrate via is the same as the thickness of the further metal via layer in the further through-substrate via.

In a further variant of the method, a dielectric sidewall layer is formed for the through-substrate via and, by the same method step together with the dielectric sidewall layer, a further dielectric sidewall layer is formed for the further through-substrate via, the metal via layer is arranged on the dielectric sidewall layer, so that the dielectric sidewall layer insulates the metal via layer from the semiconductor substrate, and the further metal via layer is arranged on the further dielectric sidewall layer, so that the further dielectric sidewall layer insulates the metal via layer from the semiconductor substrate.

In a further variant of the method, the metal via layer and the dielectric sidewall layer are arranged in the through-substrate via similarly to the further metal via layer and the further dielectric sidewall layer in the further through-substrate via.

In a further variant of the method, a dielectric cover layer is arranged on the metal via layer, so that the dielectric cover layer laterally surrounds the through-substrate via.

In a further variant of the method, a dielectric layer is arranged covering the further metal via layer in the further through-substrate via.

In a further variant of the method, the dielectric layer is arranged without filling the further through-substrate via.

In a further variant of the method, the through-substrate via is formed in the shape of a hollow cylinder surrounding a semiconductor pillar of the substrate.

The semiconductor device with optical via and electrical via comprises a semiconductor substrate having a main surface and a further main surface opposite the main surface, a through-substrate via forming an optical via penetrating the substrate from the main surface to the further main surface, a metal via layer arranged along the through-substrate via without closing the through-substrate via, a further through-substrate via penetrating the substrate from the main surface to the further main surface, a further metal via layer arranged along the further through-substrate via without closing the further through-substrate via, and a contact pad arranged below the further main surface at a distance from the through-substrate via. The through-substrate via is left open by the metal via layer at both ends of the optical via. The further metal via layer is applied on the contact pad and is closed at one end by the contact pad.

In an embodiment of the semiconductor device, the metal via layer in the through-substrate via has the same thickness as the further metal via layer in the further through-substrate via.

A further embodiment of the semiconductor device comprises a dielectric layer on the main surface, the through-substrate via extending through the dielectric layer, a top metal layer arranged in or on the dielectric layer, and a further dielectric layer on the further main surface. The contact pad is embedded in the further dielectric layer, and the further metal via layer electrically connects the top metal layer with the contact pad.

A further embodiment of the semiconductor device comprises a zone plate arranged in the further dielectric layer above the through-substrate via.

A further embodiment of the semiconductor device comprises a grating coupler arranged in the further dielectric layer above the through-substrate via and a wave guide arranged in the further dielectric layer level with the grating coupler.

In a further embodiment of the semiconductor device, the through-substrate via is in the shape of a hollow cylinder surrounding a semiconductor pillar of the substrate.

A further embodiment of the semiconductor device comprises a further dielectric cover layer, which is arranged on the semiconductor pillar along the through-substrate via.

The optical module comprises an embodiment of such a semiconductor device and an optical device arranged above the main surface and above the through-substrate via.

In an embodiment of the optical module, a further optical device is arranged above the further main surface and above the through-substrate via.

In a further embodiment of the optical module, the optical device is a vertical cavity surface emitting laser, a photodiode or a wave guide component, and the further optical device is a vertical cavity surface emitting laser, a photodiode or a wave guide component.

A further embodiment of the optical module comprises a metal wiring above the main surface, a further metal wiring above the further main surface, bump contacts connecting the optical device to the metal wiring, and further bump contacts connecting the further optical device to the further metal wiring.

A further embodiment of the optical module comprises a board with a wave guide, and the semiconductor device is mounted on the board with the through-substrate via arranged in correspondence with the wave guide.

The following is a detailed description of examples of the semiconductor device, the optical module and the method of producing the semiconductor device in conjunction with the appended figures.

DETAILED DESCRIPTION

Figure 1:
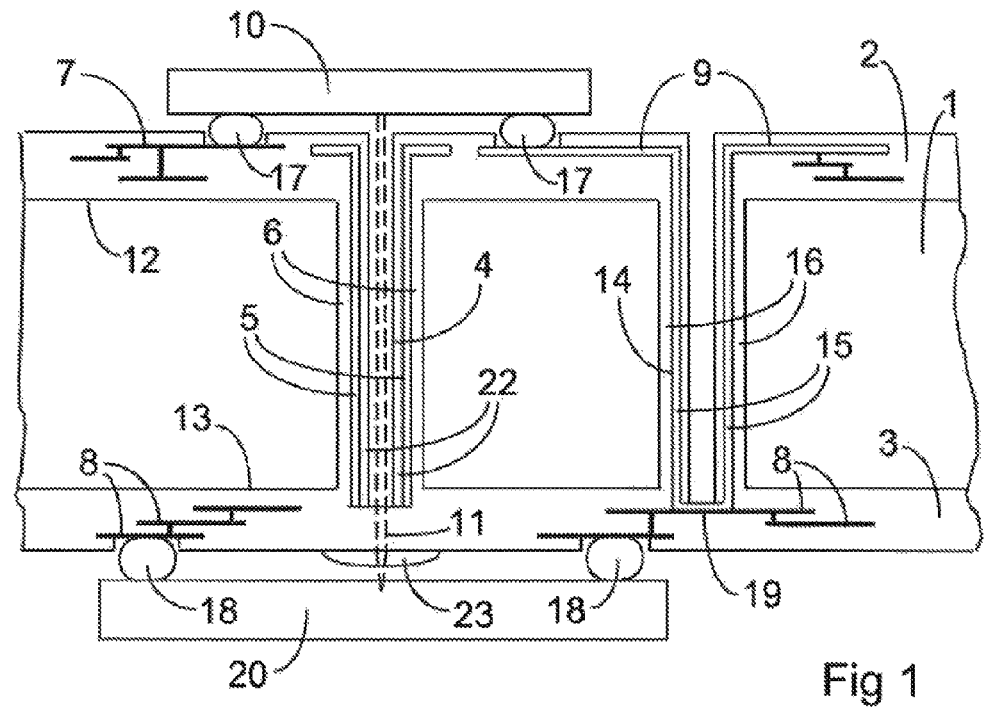
FIG. 1 is a cross section of an embodiment of an optical module including the semiconductor device.

FIG. 1 is a cross section of an optical module including a semiconductor device comprising a semiconductor substrate 1, which may be silicon, for instance. A dielectric layer 2 is arranged on or above a main surface 12 of the substrate 1, and a further dielectric layer 3 is arranged on or above the opposite main surface 13 of the substrate 1. An optical via 4 penetrates the substrate 1 and provides a light path 11 between the levels of the main surface 12 and the further main surface 13. The light path 11 is indicated in FIG. 1 by broken lines. The optical via 4 is laterally surrounded by a metal via layer 5, which may be gold or copper, for instance, and is optionally insulated from the semiconductor material of the substrate 1 by a dielectric sidewall layer 6. The metal via layer 5 is open at both ends and thus forms a metal tube around the light path 11. In the example shown in FIG. 1, the optical via 4 comprises a void extending through the dielectric layer 2 but not through the further dielectric layer 3, which confines the metal via layer 5 near the level of the further main surface 13 of the substrate 1. An optional dielectric cover layer 22 may be applied on the metal via layer 5 in the optical via 4.

A metal wiring 7 is embedded in the dielectric layer 2, and a further metal wiring 8 is embedded in the further dielectric layer 3. The wirings 7, 8 may comprise one or more structured metallization layers and vertical interconnections and may serve as electrical connections of terminals of electronic components integrated in the substrate 1. A top metal layer 9 forms a contact for an external electrical connection of a through-substrate via 14, which is provided as an electrical interconnection through the substrate 1. The electrical through-substrate via 14 comprises a further metal via layer 15, which is optionally insulated form the semiconductor material of the substrate 1 by a further dielectric sidewall layer 16. The further metal via layer 15 is electrically connected with a contact pad 19, which is arranged on the further dielectric layer 3 or embedded in the further dielectric layer 3. The contact pad 19 can be part of the further wiring 8 and can thus especially be connected with terminals of integrated components and/or with further contact pads for external electrical connection.

Bump contacts 17 on the metal wiring 7 serve as electrical connections to an optical device 10 mounted above the main surface 12. The optical device 10 may be a vertical cavity surface emitting laser, a photodiode or a wave guide component, for instance. Further bump contacts 18 on the further metal wiring 8 serve as electrical connections to a further optical device 20 mounted above the further main surface 13. The further optical device 20 may also be a vertical cavity surface emitting laser, a photodiode or a wave guide component, for instance. If the optical device 10 is a light emitting device like a VCSEL, for instance, the further optical device 20 may be a photodiode, for instance. The light is emitted in the direction of the light path 11 through the optical via 4 and may be focused into the light receiving area of the photodiode by a lens 23 arranged on the surface of the further dielectric layer 3. Such a lens 23 can be formed by imprinting techniques, especially by nano-imprinting techniques known per se, or it can be mounted as a separate device during assembly of the optical module.

The embodiment according to FIG. 1 is only an example of a variety of applications for an arrangement of optical devices that are optically connected with one another through the optical via 4. Further active optical devices and passive optical devices like mirrors, for instance, may be mounted to the substrate 1. The direction of light propagation may be reversed with respect to the example shown in FIG. 1. A plurality of optical vias may be provided in the same substrate for light propagation in different directions, thus connecting a plurality of active and passive optical devices and providing an easy way of optically connecting components arranged in an optoelectronic module.

The boundary between the dielectric sidewall layer 6 and the metal via layer 5 or the boundary between the metal via layer 5 and the dielectric cover layer 22 may be used for the propagation of light through the optical via 4 by means of surface plasmon-polaritons (SPPs). SPPs are collective charge oscillations generated at the interface of a dielectric and a metal by incident photons coupling with surface plasmons. SPPs sustain the propagation of electromagnetic waves along the interface between the dielectric and the metal. A metal via layer 5 of gold or copper may be suitable in this embodiment for the generation of SPPs.

The optical via 4 and the electrical through-substrate via 14 have similar structures except for the optical via 4 being open at both ends, whereas the electrical through-substrate via 14 is closed by the contact pad 19. Because of the structural similarities, one or more optical vias 4 and one or more electrical through-substrate vias 14 can be produced together with essentially the same method steps.

In the method of production, via holes are etched through the substrate 1 from the main surface 12. At least one via hole is provided for an optical via 4 and is formed at a distance from the contact pad 19. At least one further via hole is provided for an electrical through-substrate via 14 serving as electrical interconnection and is formed reaching the contact pad 19. Dielectric sidewall layers 6, 16 are optionally formed at the sidewalls of the via holes to insulate the semiconductor material from metallizations that are subsequently applied. The dielectric sidewall layers 6, 16 can be formed together in the same method step.

The metal via layer 5 is deposited in the shape of a hollow cylinder in the via hole provided for the optical via 4, and the further metal via layer 15 is deposited in the via hole provided for the electrical through-substrate via 14 and may also form a hollow cylinder. The metal via layer 5 and the further metal via layer 15 can be applied together in the same method step. Hence the arrangement of the metal via layer 5 and the dielectric sidewall layer 6 in the optical via 4 can be similar to the arrangement of the further metal via layer 15 and the further dielectric sidewall layer 16 in the electrical through-substrate via 14. In particular, the metal via layer 5 at the sidewall of the optical via 4 and the portion of the further metal via layer 15 that is arranged at the sidewall of the electrical through-substrate via 14 can have the same thickness.

The dielectric cover layer 22 may be applied in the same method step together with a portion of the dielectric layer 2 covering the further metal via layer 15 at the sidewall of the electrical through-substrate via 14. In this case the dielectric cover layer 22 and the portion of the dielectric layer 2 covering the further metal via layer 15 at the sidewall of the electrical through-substrate via 14 may have the same thickness.

The further metal via layer 15 contacts the contact pad 19 at the bottom of the via hole. The metal via layer 5 is removed from the bottom of the via hole that is provided for the optical via 4, so that the metal via layer 5 is open at both ends and forms a metal tube allowing free passage of light.

The removal of the bottom portion of the metal via layer 5 can be effected by anisotropically etching, especially by an anisotropic reactive ion etch step (RIE), with no or extremely low etch rate at the vertical sidewall and maximal etch rate on the horizontal bottom surface.

Figure 2:
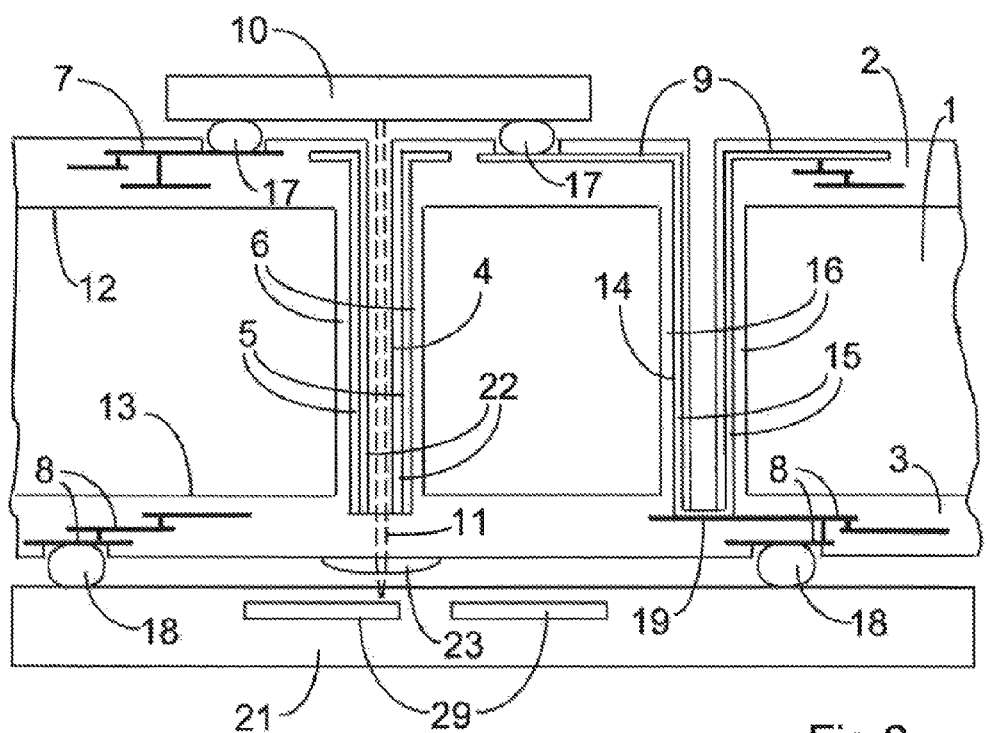
FIG. 2 is a cross section of a further embodiment mounted on a board.

FIG. 2 is a cross section according to FIG. 1 for a further embodiment. Components of the embodiment according to FIG. 2 that correspond to components of the embodiment according to FIG. 1 are designated with the same reference numerals. The embodiment according to FIG. 2 comprises a board 21, which may be a printed circuit board comprising conductor tracks and/or wave guides 29, for instance. Wave guides 29 arranged in the board 21 are schematically indicated in FIG. 2. The light that is guided through the optical via 4 along the light path 11 indicated with broken lines is coupled into the wave guides 29 and propagates through the wave guides 29 in the board 21. In the embodiment according to FIG. 2, the further bump contacts 18 are arranged on the further metal wiring 8 and serve as electrical connections to conductor tracks of the board 21.

Figure 3:
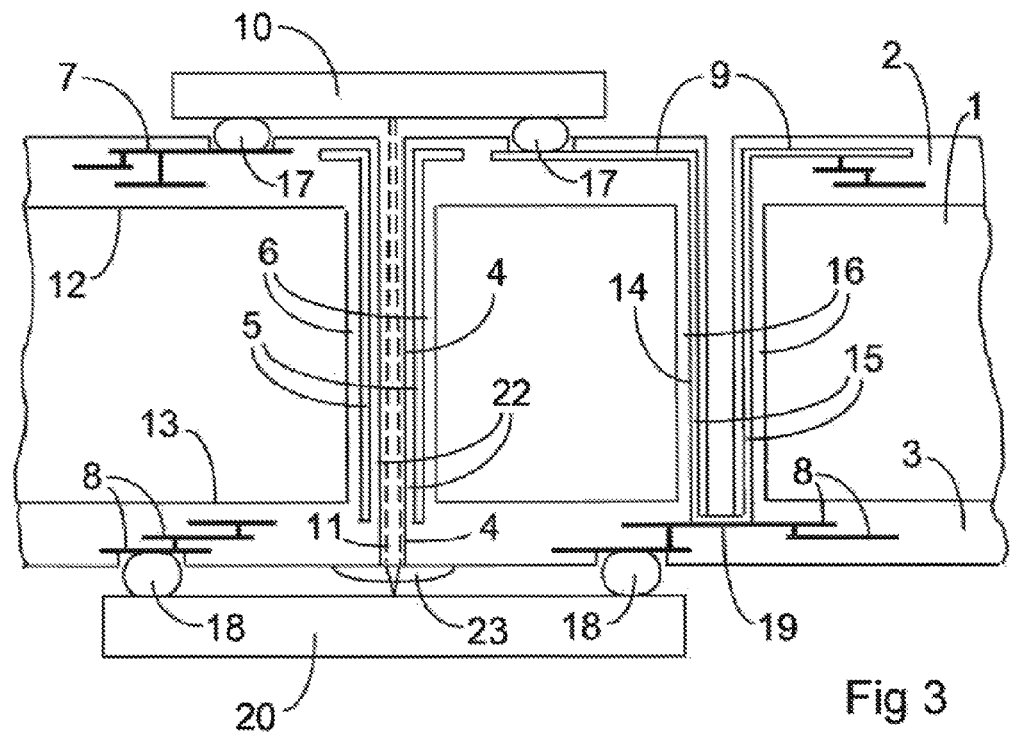
FIG. 3 is a cross section of a further embodiment comprising a prolonged cavity of the optical via.

FIG. 3 is a cross section according to FIG. 1 for a further embodiment. Components of the embodiment according to FIG. 3 that correspond to components of the embodiment according to FIG. 1 are designated with the same reference numerals. In the embodiment according to FIG. 3, the light path 11 does not lead through a portion of the further dielectric layer 3. Instead, the central void of the optical via 4 extends through the further dielectric layer 3, so that the light does not have to propagate through a layer of dielectric material. In the manufacturing process, the further dielectric layer 3 can be opened at the lower end of the optical via 4 by drilling, for example, or by a masked etching step.

In FIG. 3, the arrangement of optical devices 10, 20 mounted to the substrate 1 is represented as in FIG. 1, but this is only one example. The substrate 1 of the embodiment according to FIG. 3 may instead be mounted on a board 21, for instance, as in the embodiment according to FIG. 2.

Figure 4:
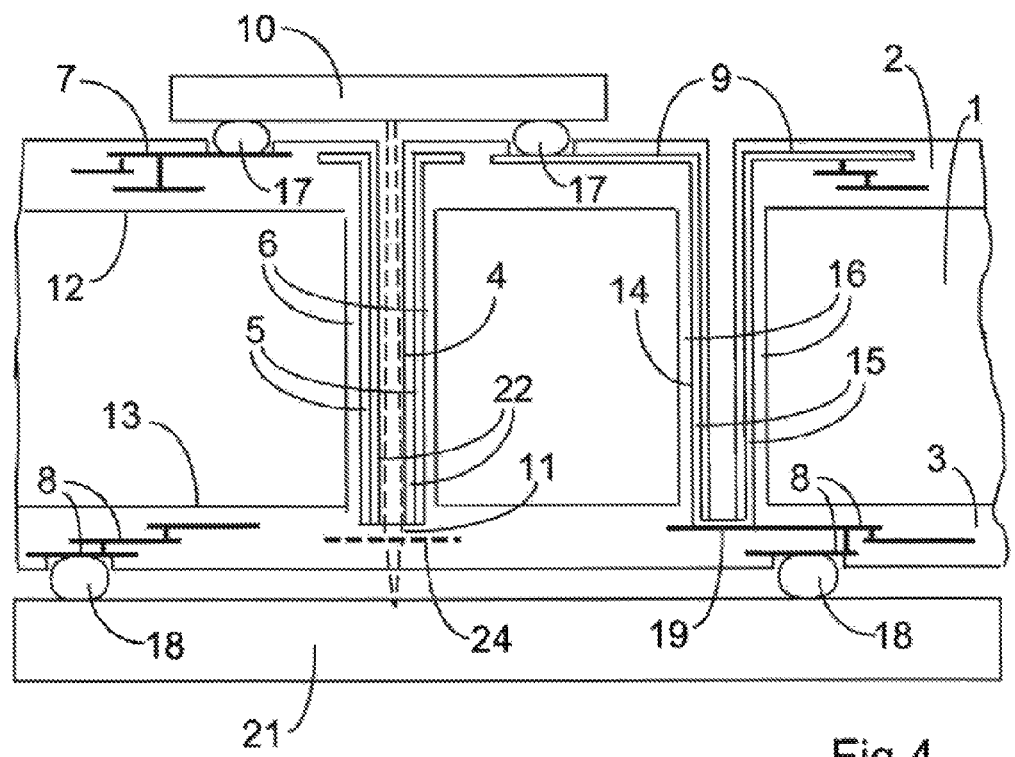
FIG. 4 is a cross section of a further embodiment comprising a zone plate.

FIG. 4 is a cross section according to FIG. 2 for a further embodiment. Components of the embodiment according to FIG. 4 that correspond to components of the embodiment according to FIG. 2 are designated with the same reference numerals. In the embodiment according to FIG. 4, the light is focused by means of a diffracting element like a zone plate 24 embedded in the further dielectric layer 3. A zone plate comprises a set of radially symmetric Fresnel zones, which are spaced to generate constructive interference at the desired focus. The Fresnel zones are formed by concentric circular regions of suitably varying diameters, widths and distances, which are formed from a material that has a refractive index different from the refractive index of the further dielectric layer 3. By suitably adapting the shape of the concentric circular regions, a phase shift zone plate, wherein half wavelength phase delays are created between adjacent ring zones, or a Fresnel lens can be formed. Zone plates, Fresnel lenses and their application to semiconductor devices are known per se and need not be described in detail.

The arrangement of the substrate 1 with an optical device 10 and a board 21 shown in FIG. 4 is similar to the embodiment according to FIG. 2, but other arrangements of optical devices are also suitable in combination with a substrate 1 comprising a zone plate 24, like the devices 10, 20 of the embodiments according to FIG. 1 and FIG. 3, for example.

Figure 5:
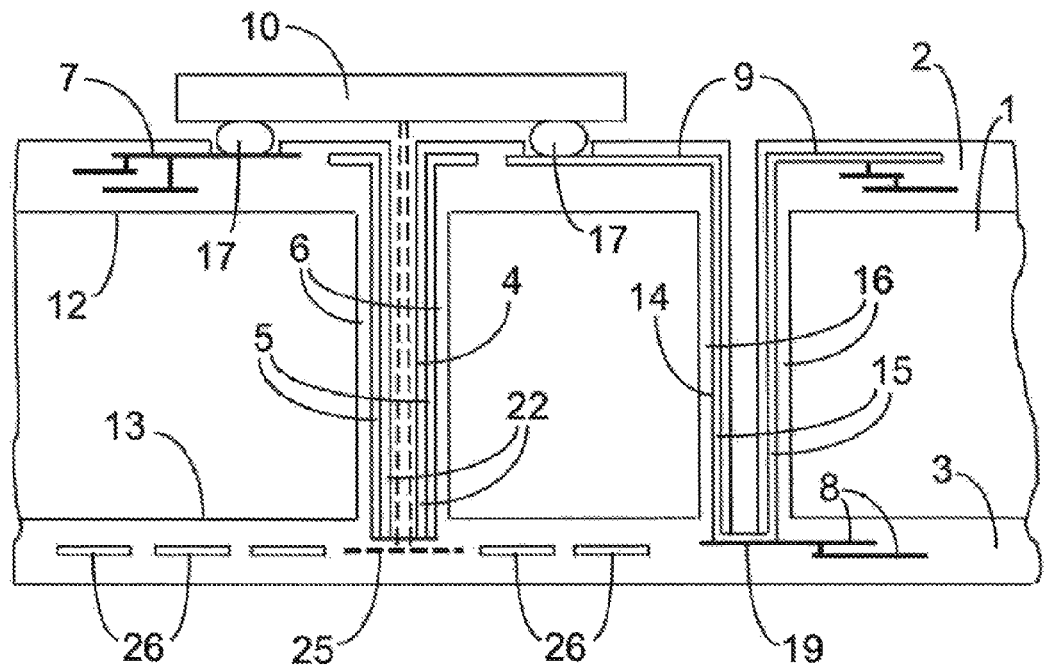
FIG. 5 is a cross section of a further embodiment comprising a grating coupler.

FIG. 5 is a cross section according to FIGS. 1 to 4 for a further embodiment. Components of the embodiment according to FIG. 5 that correspond to components of the embodiments according to FIGS. 1 to 4 are designated with the same reference numerals. In the embodiment according to FIG. 5, the light path 11 through the optical via 4 enters a grating coupler 25, which directs the light into a wave guide 26 embedded in the further dielectric layer 3 or arranged on the further dielectric layer 3. The wave guide 26 can thus be integrated on the substrate 1, so that an application of a board 21 comprising an external wave guide 29, as in the embodiment according to FIG. 2, may be avoided.

Figure 6:
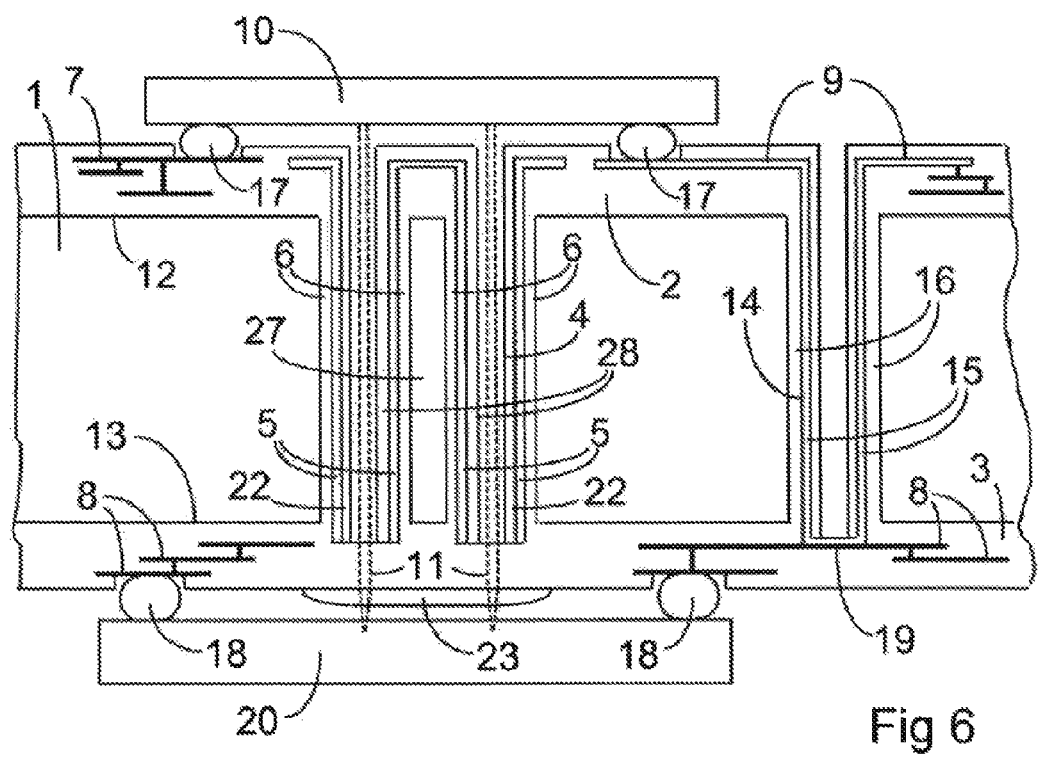
FIG. 6 is a cross section of a further embodiment with a central pillar of semiconductor material arranged in the optical via.

FIG. 6 is a cross section according to FIG. 1 for a further embodiment. Components of the embodiment according to FIG. 6 that correspond to components of the embodiment according to FIG. 1 are designated with the same reference numerals. In the embodiment according to FIG. 6, the optical via 4 has the shape of a hollow cylinder surrounding a pillar 27 of the semiconductor material of the substrate 1. The metal via layer 5 has the shape of two concentric hollow cylinders, an outer cylinder corresponding to the metal via layer 5 of the embodiments previously described and an inner cylinder forming a central portion of the metal via layer 5 at the sidewall of the pillar 27. The optical via 4 extends between the outer cylinder and the inner cylinder of the metal via layer 5. The central portion of the metal via layer 5 is optionally insulated from the sidewall of the pillar 27 by a central portion of the dielectric sidewall layer 6.

A further dielectric cover layer 28 may be arranged on the central portion of the metal via layer 5. The boundary between the central portion of the metal via layer 5 and the central portion of the dielectric sidewall layer 6 or the boundary between the central portion of the metal via layer 5 and the further dielectric cover layer 28 may additionally be used for light propagation by means of surface plasmon-polaritons as described above.

The semiconductor pillar 27 is formed by etching the via hole for the optical via 4 in the shape of a hollow cylinder. The semiconductor pillar 27 may therefore rest on a portion of the further dielectric layer 3.

The invention has the advantage that light signal transfer is enabled by through-substrate vias that are conventionally created for electrical connections between conductors on one side of a substrate and conductors on the opposite side. The necessary modifications of the through-substrate vias do not require a dedicated further etching step and do not go beyond conventional production techniques.

The invention claimed is:

1. A method of producing a semiconductor device with optical via and electrical via, comprising:
   providing a semiconductor substrate having a main surface and an opposite further main surface with a contact pad arranged below the further main surface;
   forming a through-substrate via from the main surface to the further main surface at a distance from the contact pad and, by the same method step together with the through-substrate via, forming a further through-substrate via from the main surface to the further main surface the contact pad;
   arranging a hollow metal via layer in the through-substrate via and, by the same method step together with the metal via layer, arranging a further metal via layer in the further through-substrate via, the further metal via layer contacting the contact pad; and
   removing a bottom portion of the metal via layer to form an optical via laterally surrounded by the metal via layer.

2. The method of claim 1, wherein the metal via layer is formed having a thickness in the through-substrate via; and
   the further metal via layer is formed having a further thickness in the further through-substrate via, so that the thickness and the further thickness are the same.

3. The method of claim 1, further comprising:
   forming a dielectric sidewall layer for the through-substrate via and, by the same method step together with the dielectric sidewall layer, forming a further dielectric sidewall layer for the further through-substrate via;
   arranging the metal via layer on the dielectric sidewall layer, so that the dielectric sidewall layer insulates the metal via layer from the semiconductor substrate; and
   arranging the further metal via layer on the further dielectric sidewall layer, so that the further dielectric sidewall layer insulates the metal via layer from the semiconductor substrate.

4. The method of claim 3, wherein an arrangement of the metal via layer and the dielectric sidewall layer in the through-substrate via is similar to an arrangement of the further metal via layer and the further dielectric sidewall layer in the further through-substrate via.

5. The method of claim 1, further comprising:
   arranging a dielectric cover layer on the metal via layer, the dielectric cover layer laterally surrounding the through-substrate via.

6. The method of claim 1, further comprising:
   arranging a dielectric layer covering the further metal via layer in the further through-substrate via.

7. The method of claim 6, wherein the dielectric layer is arranged without filling the further through-substrate via.

8. The method of claim 1, wherein the through-substrate via is formed in the shape of a hollow cylinder surrounding a semiconductor pillar of the substrate.

* * * * *